United States Patent
Anderson et al.

(10) Patent No.: US 8,120,480 B2
(45) Date of Patent: Feb. 21, 2012

(54) SENSING CIRCUIT BOARD COMMUNICATIONS MODULE ASSEMBLY

(75) Inventors: Dean S. Anderson, Cologne, MN (US); Danny J. Vatland, Chanhassen, MN (US); Brian J. Bischoff, Red Wing, MN (US)

(73) Assignee: Healthsense, Inc., Mendota Heights, MN (US)

(*) Notice: Subject to any disclaimer, the term of this patent is extended or adjusted under 35 U.S.C. 154(b) by 866 days.

(21) Appl. No.: 12/141,531

(22) Filed: Jun. 18, 2008

(65) Prior Publication Data

US 2009/0315701 A1 Dec. 24, 2009

(51) Int. Cl.
*G08B 1/08* (2006.01)

(52) U.S. Cl. ............ 340/539.1; 340/539.23; 340/523; 340/529; 340/573.1; 340/573.4; 340/540; 340/541; 361/760; 361/761; 361/764; 361/752; 361/807

(58) Field of Classification Search .......... 340/539.1, 340/539.23, 523, 529, 573.1, 573.4, 540, 340/541; 361/760, 761, 764, 752, 807
See application file for complete search history.

(56) References Cited

U.S. PATENT DOCUMENTS

| | | | |
|---|---|---|---|
| 4,284,849 A * | 8/1981 | Anderson et al. | 379/38 |
| 4,567,543 A | 1/1986 | Miniet | |
| 5,590,648 A | 1/1997 | Mitchell et al. | |
| 5,761,036 A * | 6/1998 | Hopfer et al. | 361/704 |
| 6,021,044 A * | 2/2000 | Neville et al. | 361/700 |
| 6,735,479 B2 | 5/2004 | Fabian et al. | |
| 6,876,841 B1 | 4/2005 | Kosaka | |
| 2005/0190824 A1 | 9/2005 | Grande et al. | |
| 2005/0258518 A1 | 11/2005 | Yang et al. | |
| 2007/0085690 A1 | 4/2007 | Tran | |
| 2007/0270671 A1* | 11/2007 | Gal | 600/301 |

* cited by examiner

*Primary Examiner* — Tai T Nguyen
(74) *Attorney, Agent, or Firm* — Brooks, Cameron & Huebsch, PLLC

(57) ABSTRACT

Methods, devices, and systems for electronic wireless communication in circuits for monitoring one or more activities of an individual are disclosed. One circuit board assembly embodiment includes a carrier board portion having a module contact pattern to electrically connect a module, selected from a plurality of different module types each having a contact pattern that corresponds to the module contact pattern of the carrier board portion, to a number of electrical components attached to the carrier board portion; a sensor portion for sensing one or more activities of an individual, the sensor portion electrically connected to the carrier board portion; and a communications module portion selected from the plurality of different module types, wherein the module portion has a contact pattern that corresponds to the module contact pattern and wherein the communications module portion is electrically connected to the carrier board portion via the module contact pattern.

19 Claims, 5 Drawing Sheets

SENSING CIRCUIT BOARD COMMUNICATIONS MODULE ASSEMBLY

BACKGROUND OF THE DISCLOSURE

Methods, devices, and systems have been developed in various fields of technology for electronic communication. For example, circuit boards have been used in various methods of electronic communication to provide physical support for various electrical components and to electrically couple various electrical components together.

A circuit board can, for instance, be used to mechanically support and electrically connect electronic components using conductive pathways and/or traces, etched from copper sheets laminated onto a non-conductive substrate. A common type of circuit board is a printed circuit board (PCB).

Printed circuit boards can be made by bonding a layer of copper over the entire substrate and removing unwanted copper after applying a temporary mask (e.g. by etching), leaving only the desired copper traces. Some printed circuit boards can be made by adding traces to the substrate by a complex process of multiple electroplating steps.

Some approaches for printing a circuit board using subtractive method include silk screen printing, photoengraving, and PCB milling, among others. Silk screen printing, for example, can use etch-resistant inks to protect the copper foil and subsequent etching removes the unwanted copper.

Photoengraving can use a photomask and chemical etching to remove the copper foil from the substrate. PCB milling can use a two or three-axis mechanical milling system to mill away the copper foil from the substrate.

Electronic components can be attached to a printed circuit board to form a functional printed circuit assembly (PCA). In through-hole construction, component leads can be inserted in holes. In surface-mount construction, the components can be placed on pads and/or lands on the outer surfaces of the printed circuit board. In both kinds of construction, component leads can be electrically and mechanically fixed to the board with molten metal solder. The electrical components can be electrically coupled together to form an electrical, device that can be part of a communications system.

A number of electrical components can be physically and electrically coupled to the circuit board. Such circuit boards can, for example, include communications modules that can be used in a system for electrical communication, including wireless communication.

A component's placement on the circuit board is dependent on the contact pattern that is created by the contacts on the circuit board. Circuit boards can be mass produced at a reduced cost, but are limited in their functionality as they are designed to be used in one configuration with one set of components. Accordingly, when a new configuration is to be used, a circuit designer has to create a new design, verify that the design will work, and in some instances, get the design approved for use.

Circuit boards can also be custom fabricated to create any desired contact pattern that can accommodate a given electrical component. Circuit boards with a custom contact pattern are flexible with regard to their electrical component compatibility, but can be more costly and/or time consuming to fabricate.

In the field of wireless sensing circuits for monitoring the activities of an individual, a circuit board assembly for a sensor has at least one sensing component, a power supply, and a communications component, however, the types of components used may differ by application. As discussed above, each time a different component is to be implemented, the circuit designer has to design, assemble, verify it will work for the application based upon the characteristics of the circuit and have the circuit approved for use, if necessary. This can be a time consuming and/or expensive process in some instances.

DETAILED DESCRIPTION OF THE DISCLOSURE

Figure 1:
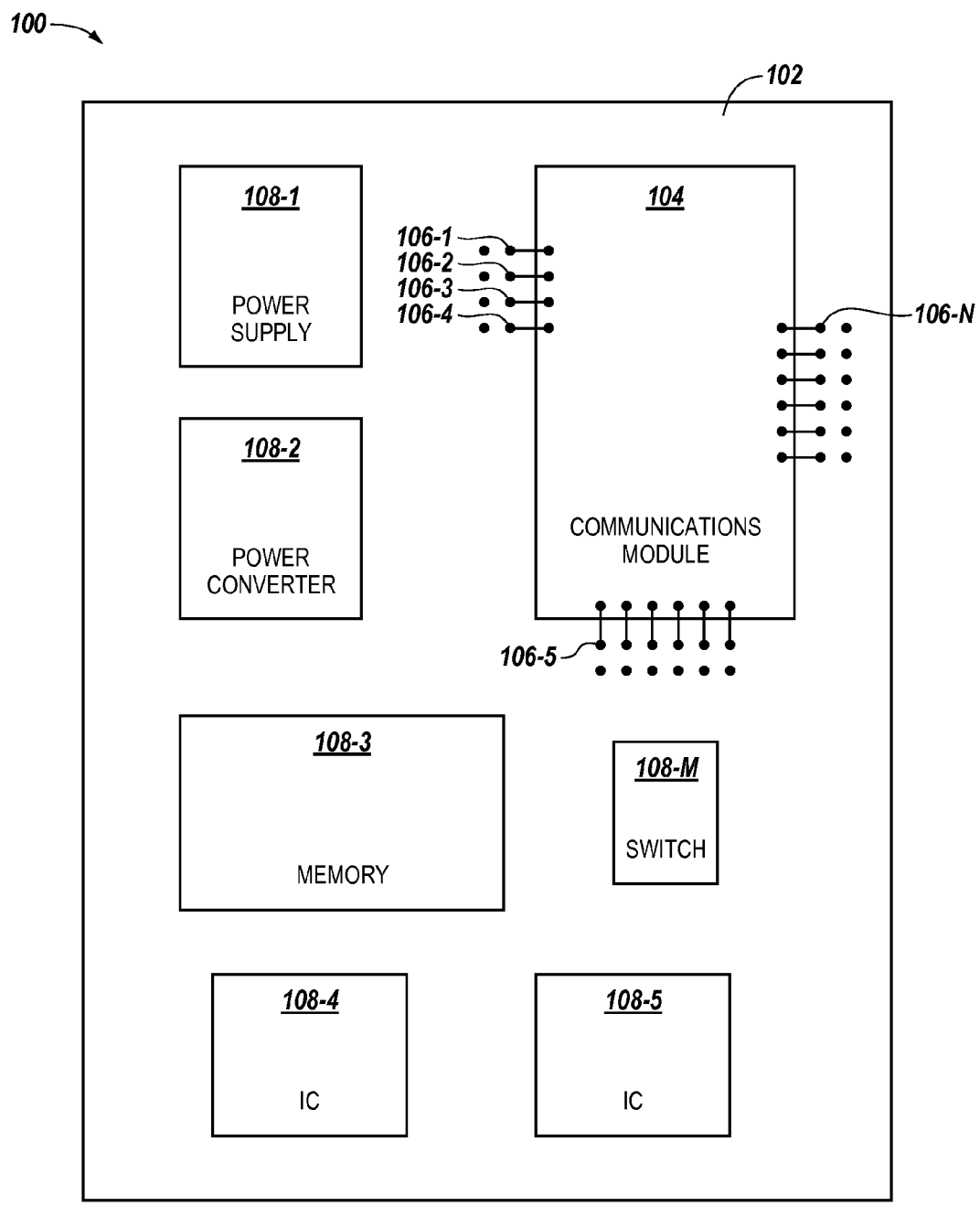
FIG. 1 illustrates a circuit board with a carrier forming the base of the board to which other components may be attached and a communications module that is attached to the carrier according to an embodiment of the present disclosure.

Embodiments of the present disclosure include systems, methods, and devices for electronic wireless communication in circuits for monitoring one or more activities of an individual. Some embodiments, for example, include a carrier board portion. The carrier board portion can have a module contact pattern to electrically connect a module, selected from a plurality of different module types that each have a contact pattern that corresponds to the module contact pattern of the carrier board portion, to a number of electrical components attached to the carrier board portion.

In various embodiments, wireless communication can occur through the use of communications modules on the circuit board. As stated above, electrical components, such as a communications module, can be coupled to the carrier. This can be accomplished, for example, by utilizing a circuit board that has a number of contacts where electrical components can be coupled. Such circuit boards can couple various electrical components together via the contacts and electrical conductive paths designed and arranged on the carrier.

Accordingly in some embodiments, a carrier of a circuit board can be designed to include various contact patterns arranged on the carrier to accommodate the coupling of various electrical components. The arrangement of the various contact patterns on the circuit board can be a factor in determining what electrical components can be coupled to the carrier.

However, in circuit board manufacture, the amount of space a board takes up and/or the functionalities to be placed on the board can determine the design of the components on the board and/or the arrangement of such components, in some instances. This can also be the case with arrangement of components, such as a communications module, on a board (i.e., daughter board) to be attached to a carrier. Accordingly, when different components are positioned on a daughter board, this arrangement regarding the size and/or shape of the daughter board and arrangement of components thereon may impact the design of the carrier, in some instances.

Embodiments of the present disclosure standardize the shape of the daughter boards that can be used with the carrier and/or standardize the contact pattern used to connect the daughter board to the carrier. Such embodiments allow use of a universal carrier design and/or universal daughter board design that can be implemented such that any of a plurality of daughter boards can be utilized with a carrier.

By making the contact pattern uniform, each of the carrier component configurations and/or the daughter board component configurations can receive Federal Communications Commission (FCC) and/or Underwriters Laboratory (UL) approval independently, in some applications. This can allow for the use of a number communications module types to be added to the carrier without having to be FCC and/or UL approved as a whole unit or can reduce the time line for such approvals and/or qualifications.

For example, in various embodiments, the circuit board can be utilized with a number of different communications modules that have a contact pattern to accommodate placement on the carrier (e.g., a carrier circuit board). The number of different communication modules can, for example, be WiFi, Bluetooth, Dust, and/or Zigbee 802.11/802.15.4 communications modules, among other types.

Each communications module and/or daughter board component configuration, which can include a communications module, can receive separate FCC and/or UL approval among other certifications, qualifications, and approvals. Again, these FCC and/or UL approvals allow for a number communications module types to be added to the carrier without having to be FCC and/or UL approved as a whole unit or can reduce the time line for such approvals and/or qualifications of the whole unit.

In various embodiments, the circuit board can include a number of contacts on the carrier. The contacts on the carrier can, for example, be power, ground, digital communication, digital input/output (I/O), and/or analog I/O contacts, among other contact types. In some embodiments, the contacts on the carrier can be leadless castellations.

The carrier can include the power supply to the electrical components on the carrier. Also, the carrier can include the interface connections between the modules on the carrier, light emitting diode (LED) status indicators for the electrical components on the carrier, reset buttons for the electrical components on the carrier, and various sensors, such as magnetic reed switches and/or temperature sensors.

The circuit board can be designed to accommodate a daughter board on the carrier. The daughter board can, for example, have inputs and/or outputs for digital sensors, analog sensors, and/or discrete sensors, among other components.

The daughter board can be used to implement the sensor functionality by coupling the sensors to electrical components on the daughter board, the carrier board, and/or other components in a communication system. The daughter board can include a communications module. Communications modules can provide for the connectivity between various electrical components of a communication system.

In various embodiments, the electronic communication can be part of a wireless communication system including a circuit board with a carrier. In such embodiments, the carrier can, for example, have a contact pattern and a communications module. In some embodiments, the carrier can have a contact pattern to accommodate a contact pattern for the communications module of a wireless communications device.

In some embodiments, the wireless communications device contains the circuit board, a number of sensors, and a computing device, where the sensors, the wireless communications device, and the computing device can communicate wirelessly with a network. In some embodiments, the sensors can be activity sensors that can wirelessly communicate data for monitoring an individual's daily living activities. Such systems can thereby provide technology for long term care, such as in a system for monitoring one or more activities of an individual.

In various embodiments, a system for wireless communication can include a number of sensors each having a wireless communications component. In such embodiments the wireless communications component can, for example, include a carrier board portion.

In some embodiments, the wireless communications component can also include a communications module portion. The module portion can, for example, have a contact pattern to accommodate a contact pattern for the module contact pattern. The module portion can also include a computing device that can receive information transmitted from at least one of the number of sensors via the wireless communications component.

In some embodiments, the information can be sensor data from one or more of the number of sensors and can be data about an activity of daily living based upon one or more activations of a sensor. In some embodiments, the information can, for example, be sensor performance data (e.g., sensor activation thresholds, power output) and/or sensor status data (e.g., battery power, signal strength, software or firmware update information).

In various embodiments, a kit for assembling a circuit board can include a carrier board portion. In some embodiments, the kit for assembling a circuit board can include a plurality of communications module portions. The module portions can, for example, each have a contact pattern to accommodate a contact pattern for the module contact pattern.

FIG. 1 illustrates a circuit board with a carrier forming the base of the board to which other components may be attached and a communications module that is attached to the carrier according to an embodiment of the present disclosure. In the embodiment illustrated in FIG. 1, once the communication module 104 is attached to the carrier 102 electronic communication can occur between these electrical components of circuit board 100.

In the embodiment of FIG. 1, a circuit board 100 can include a contact pattern to allow the coupling of a communications module 104 to the carrier 102. The carrier 102 and the communications module 104 can be coupled together by a number of contacts, 106-1, 016-2, 106-3, 106-4, 106-5, 106-N, that form the contact pattern.

In FIG. 1, the location of the communications module 104 on the carrier 102 is determined by the contact pattern formed by contacts 106-1 . . . 106-N. In various embodiments, the contact pattern formed by the contacts of the carrier can be in any desired pattern.

In some embodiments; a circuit board can have a carrier that has a standard contact pattern for the coupling of electrical components to the carrier. A standard contact pattern can allow for ease in assembling the circuit board, as an assembler and/or automated process can use the same coupling method for each electrical component that is coupled to the carrier.

In some embodiments, the electrical components to be attached to the carrier can have a standardized contact pattern. In such embodiments, the components can be interchanged on the carrier at the time of manufacture and/or in the field.

In FIG. 1, a contact pattern is formed on the carrier 102 by contacts, 106-1 . . . 106-N. The contact pattern can be a contact pattern that matches a specific electrical component that can be coupled to the carrier 102. In FIG. 1, a communications module 104 is the electrical component that is coupled to the carrier 102. The communications module 104 has a contact pattern that matches the contact pattern of the carrier 102 allowing for ease in coupling the communications module 104 to the carrier 102.

In various embodiments, a number of different types of communications modules can be utilized with a carrier. The communications modules can be configured for different types of communications protocol and still be coupled a carrier with a given contact pattern, if the communications module is fabricated to have a corresponding contact pattern.

Therefore, in various embodiments, a carrier can be produced with a given contact pattern and a number of different communications modules can be produced, each with a contact pattern corresponding to the contact pattern of the carrier, to allow for coupling of the communications module to the carrier. In some embodiments, a number of different communications modules can be produced with the same contact pattern and the carrier is produced with a contact pattern that corresponds to the pattern of the communications modules.

In FIG. 1, the circuit board 100 includes a number of electrical components, 108-1 . . . 108-M. The electrical components can be part of a communication system. The circuit board 100 includes a power supply 108-1, a power converter 108-2, memory 108-3, integrated circuits 108-4 and 108-5, and a switch 108-M. In various embodiments, any number and combination of various electrical components, such as those illustrated in the embodiment of FIG. 1 and others, can be used on the circuit board.

The electrical components 108-1 . . . 108-M on the carrier 102 in FIG. 1 are positioned on the carrier 102 to allow space for the contact pattern formed by contacts 106-1 . . . 106-N. The contacts 106-1 . . . 106-N correspond to the contact pattern of communications module 104, thereby allowing for the coupling of the communications module 104 to the carrier 102, while still having all of the electrical components 108-1 . . . 108-M on the carrier.

In some embodiments, a circuit board can allow the addition of one or more communications modules to a carrier having one or more other functions. The one or more communications modules can be used, for example, to transfer data, such as sensor data, used in a number of contexts, such as a home health care application. In some embodiments, the communications modules can have the same contact pattern to allow a carrier to have a contact pattern that can be used to receive a communications module selected from a number of types of communications modules that each have the same contact pattern which corresponds to the contact pattern of the carrier.

Figure 2:
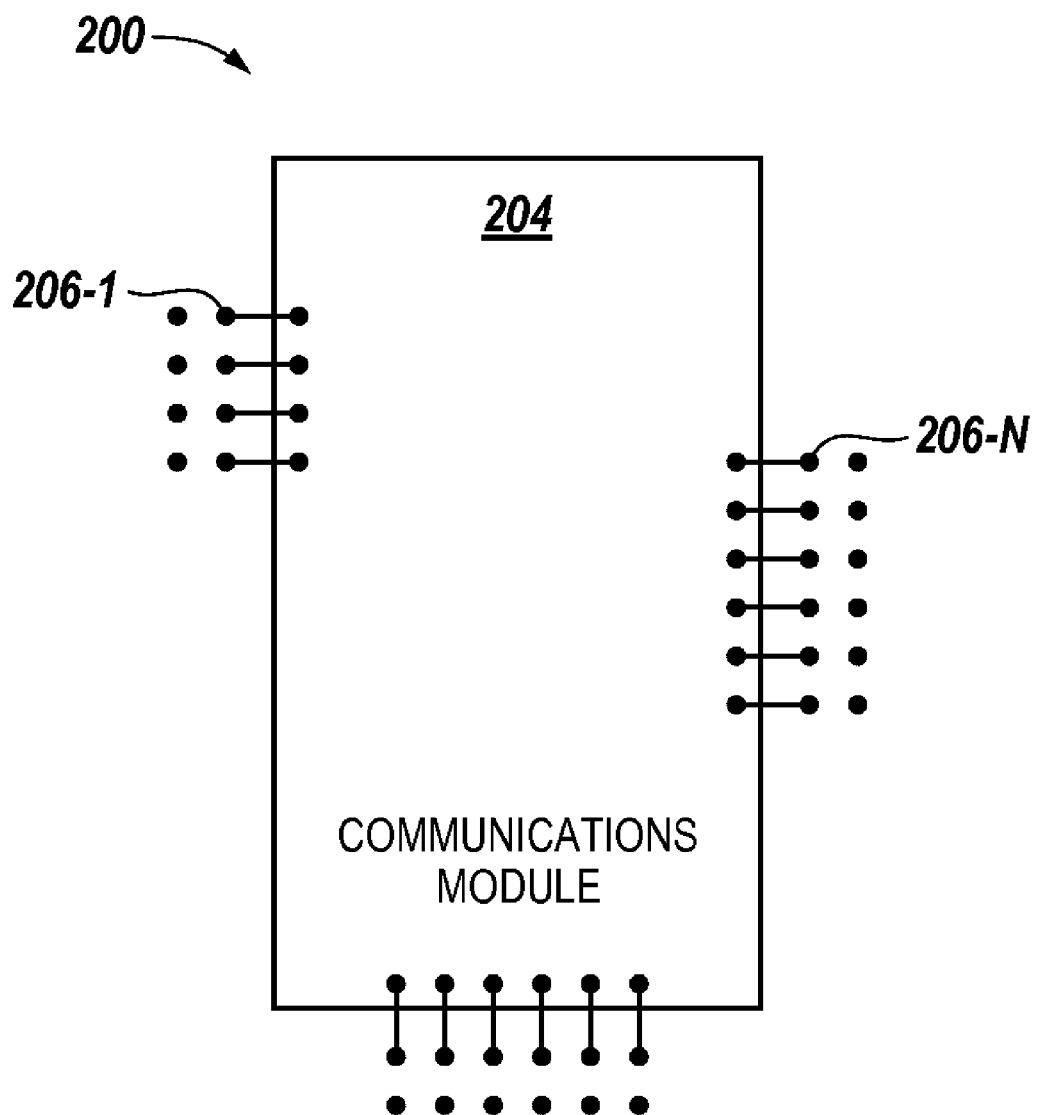
FIG. 2 illustrates a communications module according to an embodiment of the present disclosure.

FIG. 2 illustrates an embodiment of a communications module 204 according to the present disclosure. Communications module 204 can be coupled to a carrier provided as circuit board 200. In FIG. 2, communications module 204 can be a number of communications module types. For example, communications module 204 can be a WiFi, Bluetooth, Dust, or Zigbee 802.11/802.15.4 communications module, among other communications protocol types.

In various embodiments, a number of wireless communications protocols can be used to transmit data between various electrical devices. In some embodiments, a circuit board can have a communications module to transmit and receive data to and/or from a sensor, or other device.

The transmission from a sensor can be wired or wireless communication. The communications module can then transmit the data from the sensor to the computing device.

In some embodiments, the communications module can be wired to the computing device to transfer the sensor data to the computing device. In other embodiments, the communications module can be located remotely from a computing device and transmit data from sensor to a computing device wirelessly.

In the embodiment of FIG. 2, a contact pattern is formed by contacts 206-1 . . . 206-N. For example, a number of the same or different types of contact can be made with the various contacts 206-1 . . . 206-N. Contacts 206-1 . . . 206-N can be contact for power, ground, digital communication, digital I/O, and/or analog I/O, among other contact types.

In various embodiments, a number of communications protocols can be used by a communications module to communicate and transfer data to other electrical components. In some embodiments, a WiFi communications module can be used on the carrier.

In these embodiments, the carrier and communications module can be part of an electrical device that is connected to a WiFi network. WiFi networks can be used to wirelessly connect a number of electrical components together via Internet communication. A number of devices, such as a sensor, a personal digital assistant (PDA), a cellular phone, a router, and/or a personal computer, among other devices, can be connected to a WiFi network.

In some embodiments, a Bluetooth communications module can be used on the carrier. The carrier and communications module can be part of an electrical device that is part of a personal area network (PAN) that uses the Bluetooth communication protocol to transfer data between devices in the PAN.

A Bluetooth communications module can be used in a number of electrical devices, including mobile phones, laptops, personal computers, printers, digital cameras, and/or video recorders, among other devices. A Bluetooth communications module can, for example, communicate over a secure, globally unlicensed short-range radio frequency and can communicate between any Bluetooth enabled electrical device on the PAN that is within range.

In various embodiments, a Dust communications module can be used on the carrier. The carrier and communications module can be part of an electrical device that is part of a wireless sensor networking systems that uses the Dust communication protocol to transfer data between devices.

A Dust communications module can be used, in a number of electrical devices such as sensors and/or computing devices, among other devices. Such, modules can be used, for example, to provide standards-based wireless sensor networking, among other benefits.

In some embodiments, a Zigbee communications module can be used on the carrier. The carrier and communications module can be part of an electrical device that is part of a personal area network (PAN) that uses the Zigbee communication protocol to transfer data between devices.

A Zigbee communications module can be used in a number of electrical devices, including mobile phones, laptops, personal computers, printers, digital cameras, and/or video recorders, among other devices. A Zigbee communications module can provide secure networking for communication between devices on the PAN that use radio-frequency (RF) applications. Zigbee communications protocol can be used in embedded applications that transfer data and consume power at a rate that promotes extending the life of a power supply, such as a battery.

Figure 3:
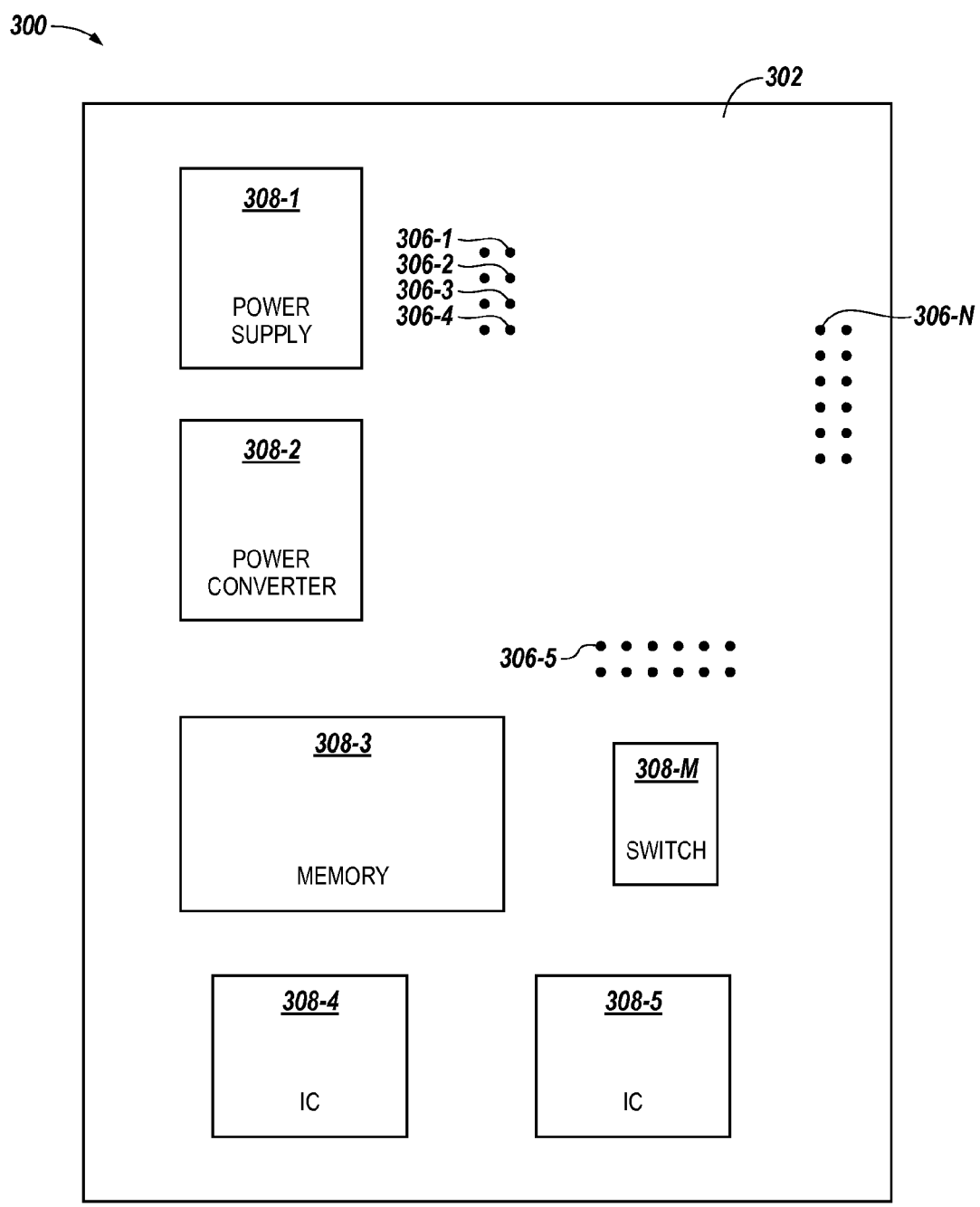
FIG. 3 illustrates a circuit board with a carrier according to an embodiment of the present disclosure.

FIG. 3 illustrates an embodiment of a circuit board with a carrier according to the present disclosure. In the embodiment of FIG. 3, circuit board 300 includes carrier 302. In FIG. 3, the circuit board 300 can include a number of electrical components, 308-1 . . . 308-M.

The electrical components 308-1 . . . 308-M can be part of a communication system. The circuit board 300 can include a power supply 308-1, a power converter 308-2, memory 308-3, integrated circuits 308-4 and 308-5, and a switch 308-M. In various embodiments, any number and/or combination of electrical components can be used on the circuit board.

The electrical components 308-1 . . . 308-M on the carrier 302 in FIG. 3 are positioned on the carrier 302 to allow for the contact pattern formed by contacts 306-1 . . . 306-N to correspond to interchangeably connect to multiple types of communications modules (e.g., one module type can be used in one type of carrier and another module can be used in another carrier). The contacts 306-1, 306-2, 306-3, 306-4, 306-5, . . . 306-N correspond to the contact pattern of a communications module, allowing for the coupling of the communications module to the carrier 302, in a configuration to allow for all of the electrical components 308-1 . . . 308-M to be placed on the carrier and to communicate or interact with the communications module, if necessary.

In some embodiments, a circuit board can allow the addition of one or more communications modules to a carrier having one or more other functions. In such embodiments, the one or more communications modules can be used to transfer data, such as sensor data, used in a number of contexts, such as a home health care application.

In some embodiments, the communications modules can have the same contact pattern which can allow a carrier to have a contact pattern that can receive a number of types of communications modules. In such embodiments, these carrier boards can be produced on a large scale with the configuration of the electrical components and then customized individually or on a large scale to accommodate different communications modules for different uses.

As discussed above, in some embodiments, the circuit board (e.g., circuit board in FIG. 3) allows for the addition of one or more communications modules to a carrier and can provide for convenient FCC and/or UL approval among other certifications, qualifications, and approvals. In some such embodiments, the communications module can be approved by the FCC or other approval or certification processes prior to being mounted to the circuit board to be used as its carrier. Then in some such embodiments, the timeline for approval of the carrier coupled with the communications module can be shortened, in some instances, because the communications module has already been approved with respect to some or all of its qualities (e.g., transmission frequency range, etc).

In various embodiments, for example, a circuit board can be evaluated for the power source, communications range, communications receive sensitivity, power consumption, and/or emissions (noise) certification for the various components included on the circuit board. Such an evaluation can allow a circuit designer to understand some qualities of the circuit board before it is combined with another component.

In some embodiments, such an evaluation may be used to gain FCC and/or UL approvals, for example. Such evaluations may allow a designer to understand what requirements will be needed, or an estimate of what may be needed, to utilize a potential combination and/or whether a potential combination will work in a system given the system's characteristics, among other benefits.

Figure 4:
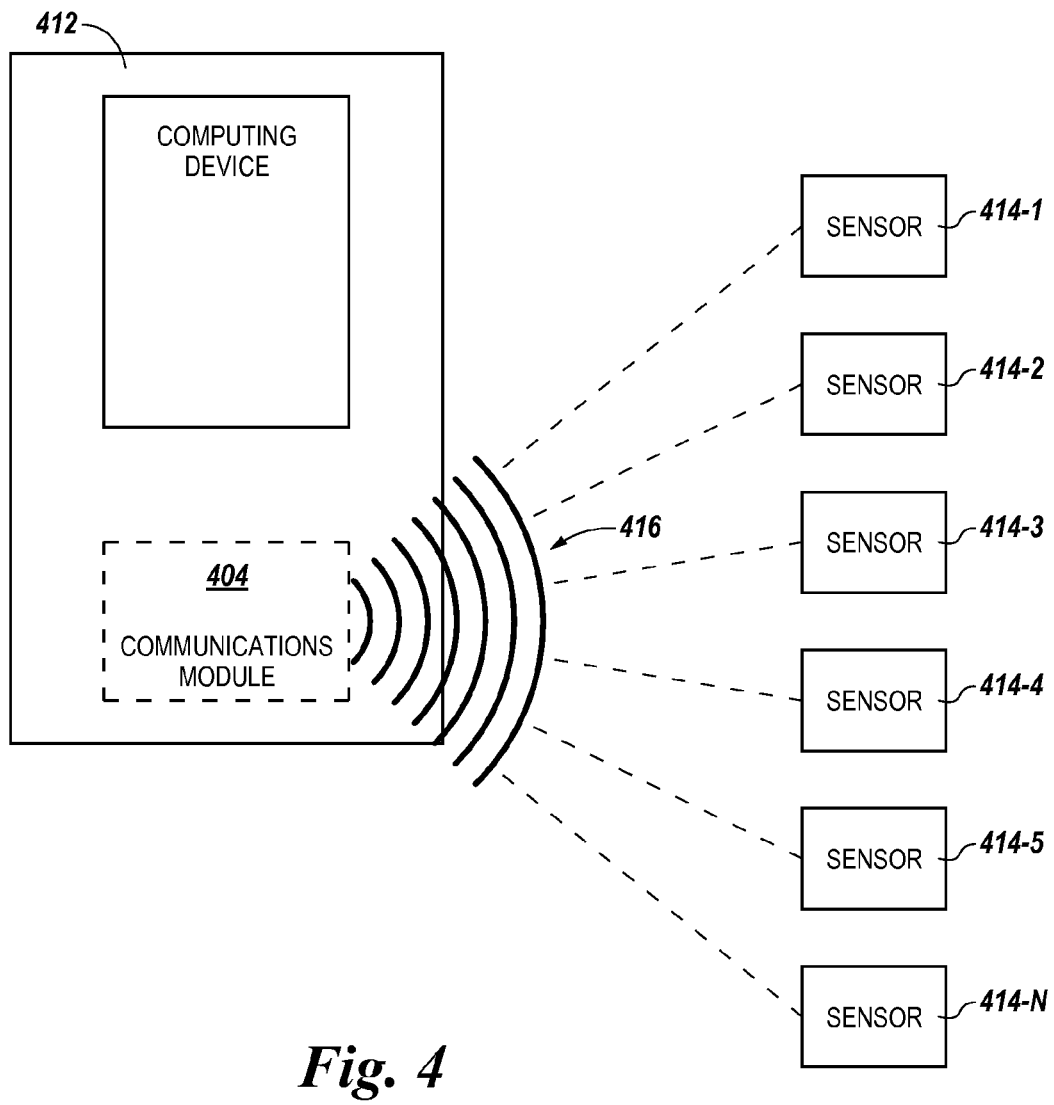
FIG. 4 illustrates a wireless communications system with a number of sensors and wireless communication device in a computing device according to an embodiment of the present disclosure.

FIG. 4 illustrates a wireless communications system with a number of sensors and wireless communication device in a computing device according to an embodiment of the present disclosure. In the embodiment of FIG. 4, the wireless communications system includes a computing device 412. A communications module 404 is in the computing device 412. The communications module 404 can send a signal 416 to a number of sensors 414-1, 414-2, 414-3, 414-4, 414-5, . . . 414-N.

The sensors 414-1 . . . 414-N can be for a variety of applications. The sensors can be temperature sensors, pressure sensors, motion detectors, timers, vibration sensors, and/or acceleration sensors, among other sensor types.

The sensors 414-1 . . . 414-N can transmit sensing data wirelessly from the sensing module in the sensors 414-1 . . . 414-N to the communications module 404. The communications module 404 can receive the data and transmit the data to the computing device 412. The computing device 412 can use the data in a variety of applications to allow a user to deduce certain conditions associated with the sensors 414-1 . . . 414-N.

In some embodiments, the sensors can be used to monitor the activities of daily living for an individual. To monitor the activity of an individual, various embodiments can provide automated detection of changes in activity within a dwelling and automated initiation of alerts to third parties to check on and/or assist the individual where assistance is needed, thereby avoiding prolonged periods of time before assistance is provided.

Some embodiments can utilize multiple sensors, multiple timers, and/or multiple rules to determine whether to initiate an action, thereby increasing the certainty that an action is necessary and should be initiated. Various embodiments also can utilize multiple sensors, multiple timers, and/or multiple rules to make statistical correlations between a number of sensors, thereby increasing certainty that the system is in satisfactory health.

In various embodiments, the communications module 404 can use a number of wireless communications protocols. The communications module 404 can be a WiFi, Bluetooth, Dust, and/or Zigbee 802.11/802.15.4 communications module, among other communications module types.

In some embodiments, the communications module is coupled to a circuit board. In such embodiments, the contact pattern of the carrier board is a discrete pattern allowing each of the various types of communications modules (e.g., WiFi, Bluetooth, Dust, and/or Zigbee 802.11/802.15.4) to be coupled to the carrier when the communications modules has a complimentary contact pattern.

Figure 5:
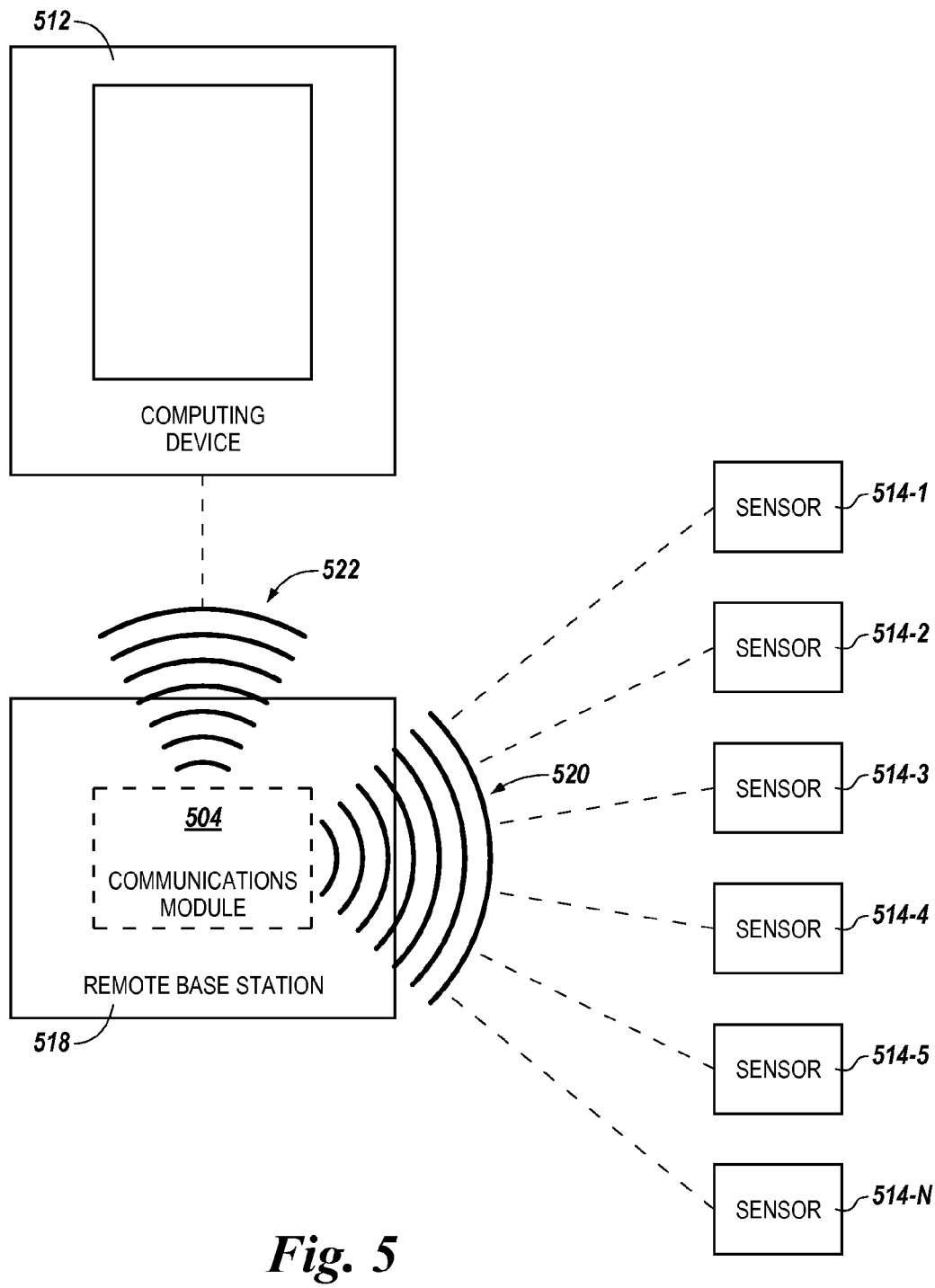
FIG. 5 a wireless communications system with a number of sensors, a remote base station, and a computing device according to an embodiment of the present disclosure.

FIG. 5 illustrates a wireless communications system with a number of sensors, a remote base station, and a computing device according to an embodiment of the present disclosure. In the embodiment of FIG. 5, the wireless communications system includes one or more computing devices 512 and a remote base station 518. A communications module 504 is in the remote base station 518. The communications module 504 can receive a signal 520 from one or more sensors such as one or more of the number of sensors 514-4, 514-2, 514-3, 514-4, 514-5, . . . 514-N.

The sensors 514-1 . . . 514-N can be utilized for a variety of applications. The sensors can be temperature sensors, pressure sensors, motion detectors, timers, vibration sensors, and/or acceleration sensors, among other sensor types. The sensors 514-1 . . . 514-N can transmit data wirelessly to the communications module 504. The communications module 504 can receive the data and transmit the data wirelessly to the computing device 512. The one or more computing devices 512 can use the data in a variety of applications to allow a user to deduce certain conditions associated with the sensors 514-1 . . . 514-N.

In the embodiment of FIG. 5, the sensors 514-1 . . . 514-N can be located in close proximity to base station 518. Although it is not a requirement that the sensors be in close proximity to the base station such placement may be beneficial for use with some types of communications protocols.

In various embodiments, data from the sensors 514-1 . . . 514-N can be transmitted to the base station 518 using a communications protocol, such as WiFi, Bluetooth, Dust, and/or Zigbee 802.11/802.15.4. The transmission protocol used can be selected based on criteria such as power consumption and/or distance with respect to the remote nature of the sensors 534-1 . . . 514-N and the base station 518.

In some embodiments, the base station 518 can then transmit the data to one or more computing devices 512. The base station 518 can transmit the data to computing device 512 using a communications protocol as discussed above, such, as WiFi, Bluetooth, Dust, and/or Zigbee 802.11/802.15.4, etc.

The transmission protocol that is used to transmit data from the base station 518 to the one or more computing devices can be different from the communications protocol used to transmit data from the sensor 514-1, . . . 514-N to the base station 518. As illustrated in the embodiment of FIG. 5, in some embodiments, the one or more computing devices 512 can be located remotely from the base station 518, such as in a different room in a house or even up to several miles away at a central processing center and/or any other remote locations.

In some embodiments, the sensors 514-1 . . . 514-N can be placed throughout a home. The sensors 514-1 . . . 514-N can be used to monitor activities of daily living for an occupant of the home.

Such sensors 514-1 . . . 514-N can be used, for example, to monitor the activities of an occupant in the home through motion, pressure, and/or vibration sensors, among other sensor types. Data from the sensors 514-1 . . . 514-N can be sent to the communications module 504 and then onto one or more computing devices 512. The one or more computing devices 512 can, for example, analyze the data from the sensors 514-1 . . . 514-N to monitor the activities of daily living for an occupant of the home by determining if the sensor data corresponds to normal or abnormal behavior, among other uses of data, such as defining performance metrics, improving sensor performance through software and/or firmware updates, and/or checking sensor status.

The Figures herein follow a numbering convention in which the first digit or digits correspond to the drawing Figure number and the remaining digits identify an element or component in the drawing. Similar elements or components between different Figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide any number of additional embodiments of the system. In addition, the elements shown in the various embodiments are not necessarily to scale. Also, the designators "N" and "M" are used to indicate that a number of the associated elements can be included in the embodiment of the Figure.

Although specific embodiments have been illustrated and described herein, those of ordinary skill in the art will appreciate that an arrangement calculated to achieve the same techniques can be substituted for the specific embodiments shown. As one of ordinary skill in the art will appreciate upon reading this disclosure, various embodiments of the invention can be performed in one or more devices, device types, and system environments including networked environments.

Combination of the above embodiments, and other embodiments not specifically described herein will be apparent to those of skill in the art upon reviewing the above description. The scope of the various embodiments of the disclosure includes other applications in which the above structures and methods can be used. Therefore, the scope of various embodiments of the disclosure should be determined with reference to the appended claims, along with the full range of equivalents to which such claims are entitled.

In the foregoing Detailed Description, various features may have been grouped together in a single embodiment for the purpose of streamlining the disclosure. This method of disclosure is not to be interpreted as reflecting an intention that the embodiments of the invention require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A circuit board assembly for sensing one or more activities of an individual, comprising:
   a carrier board portion, wherein the carrier board portion has a module contact pattern to electrically connect a module to a number of electrical components attached to the carrier board portion and wherein the module is selected from a plurality of different module types each having a contact pattern that corresponds to the module contact pattern of the carrier board portion;
   a sensor portion for sensing one or more activities of an individual, the sensor portion electrically connected to the carrier board portion; and
   a communications module portion selected from the plurality of different module types, wherein the module portion has a contact pattern that corresponds to the module contact pattern, wherein the communications module portion is electrically connected to the carrier board portion via the module contact pattern, and wherein the communications module receives information about the one or more activities of the individual from the sensor portion and sends the information to a remote device.

2. The circuit board of claim 1, wherein each of the plurality of different communications module types has a contact pattern to accommodate placement on the module contact pattern.

3. The circuit board of claim 2, wherein the module to be electrically connected to the number of electrical components is selected from a group of communications modules including: WiFi, Bluetooth, Dust, and Zigbee 802.11/802.15.4 communications module types.

4. The circuit board of claim 1, wherein the contact pattern on the carrier board portion includes one or more contacts selected from a group of contact types including: power, ground, digital communication, digital input, digital output, analog input, and analog output.

5. The circuit board of claim 1, wherein a number of contacts forming the contact pattern on the carrier board portion are leadless castellations.

6. The circuit board of claim 1, wherein the carrier board portion can accommodate a daughter board.

7. The circuit board of claim 6, wherein the daughter board has a number of inputs or outputs for digital sensors, analog sensors, or discrete sensors.

8. A method for configuring a circuit board for receiving sensing information from a sensing module for sensing an activity of an individual, comprising:
   providing a carrier, wherein the carrier has a uniform contact pattern;

providing a communications module, wherein the uniform contact pattern of the carrier accommodates a contact pattern for the communications module;

placing the communications module, selected from a plurality of different module types each having a contact pattern that corresponds to the uniform contact pattern of the carrier, on the carrier over the uniform contact pattern of the carrier and affixing the communications module to the carrier; and wherein sensing data is transmitted from a number of sensors that sense one or more activities of an individual to the communications module and wherein the sensing data is transmitted from the communications module to a remote device.

9. The method of claim 8, wherein the communications module transmits data to and from the carrier.

10. The method of claim 9, wherein the communications module is selected from a number of different communications modules that each transmit data from a number of sensors via a different type of communications module protocol.

11. The method of claim 10, wherein the communications module is selected from modules transmitting data utilizing communications module protocols selected from a group including: WiFi, Bluetooth, Dust, and Zigbee 802.11/802.15.4.

12. The method of claim 10, wherein the circuit board has one or more inputs or outputs for a numbers of digital sensors, analog sensors, or discrete sensors.

13. The method of claim 12, wherein the number of sensors communicate data relating to the monitoring of an individual's daily living activities via the communications module.

14. A system for wireless communication, comprising:
a number of sensors for sensing one or more activities of an individual each having a wireless communications component, the component including:
a carrier board portion, wherein the carrier board portion has a module contact pattern to electrically connect a module selected from a plurality of different module types each having a contact pattern that corresponds to the module contact pattern of the carrier board portion to a number of electrical components attached to the carrier board portion;
a communications module portion, wherein the communications module portion has a contact pattern to accommodate the module contact pattern; and
a computing device that receives information about one or more activities of an individual transmitted from the communications module portion, which receives the information from the number of sensors.

15. The system of claim 14, wherein the information is sensor data from one or more of the number of sensors.

16. The system of claim 14, wherein the information is data about an activity of daily living based upon one or more activations of a sensor.

17. The system of claim 14, wherein the information is sensor performance data.

18. The system of claim 14, wherein the information is sensor status data.

19. A kit for assembling a circuit board for use in a system for monitoring one or more activities of an individual, comprising:
a carrier board portion, wherein the carrier board portion has a module contact pattern to electrically connect a module to a number of electrical components attached to the carrier board portion;
a sensor portion for sensing one or more activities of an individual and having an electrical contact pattern to electrically connect the sensor portion with the carrier board portion; and
a plurality of different module types each having a contact pattern that corresponds to the module contact pattern of the carrier board portion and wherein one of the modules is to be selected and attached to the module contact pattern, wherein sensing data is transmitted from the sensor portion to a selected module and the sensing data is transmitted from the selected module to a remote device.

* * * * *